United States Patent
Cloots et al.

(10) Patent No.: US 6,197,418 B1
(45) Date of Patent: Mar. 6, 2001

(54) ELECTROCONDUCTIVE GLASS LAMINATE

(75) Inventors: Tom Cloots, Londerzeel; Frank Louwet, Diepenbeek; Hieronymus Andriessen, Beerse; Bart Verlinden, Tongeren; Jean-Pierre Tahon, Langdorp; Leo Vermeulen, Herenthout; Luc Leenders, Herentals; Rudi Goedeweeck, Rotselaar, all of (BE)

(73) Assignee: Agfa-Gevaert, N.V., Mortsel (BE)

( * ) Notice: Subject to any disclaimer, the term of this patent is extended or adjusted under 35 U.S.C. 154(b) by 0 days.

(21) Appl. No.: 09/458,829

(22) Filed: Dec. 13, 1999

Related U.S. Application Data

(60) Provisional application No. 60/122,359, filed on Mar. 2, 1999.

(30) Foreign Application Priority Data

Dec. 21, 1998 (EP) .................................................. 98204382

(51) Int. Cl.$^7$ ............................. B32B 17/10; C03C 27/12
(52) U.S. Cl. .......................... 428/332; 427/108; 427/165; 427/389.7; 336/337; 336/412; 336/430; 336/436; 336/437; 441/442

(58) Field of Search ..................................... 428/332, 336, 428/337, 412, 430, 436, 437, 441, 442; 427/108, 165, 389.7

(56) References Cited

U.S. PATENT DOCUMENTS

| 5,589,272 | 12/1996 | Braun et al. . | |
|---|---|---|---|
| 5,650,227 | * 7/1997 | Starzewski | ............................ 428/341 |
| 5,766,515 | 6/1998 | Jonas et al. . | |
| 5,770,316 | * 6/1998 | Starzewski | ............................ 428/451 |

FOREIGN PATENT DOCUMENTS 0 075 956   4/1983   (EP) .

* cited by examiner

*Primary Examiner*—D. S. Nakarani
(74) *Attorney, Agent, or Firm*—Breiner & Breiner

(57) ABSTRACT

A material is disclosed which comprises a substrate and an organic electroconductive layer provided on said substrate, characterised in that the substrate is a laminate comprising a glass layer and a support. The glass layer is preferably a flexible glass layer having a thickness from 10 to 500 $\mu$m. The material can be used as an electrode in electric or semiconductor devices thereby providing an improved lifetime, e.g. displays, photovoltaic cells or light-emitting diodes.

8 Claims, No Drawings

ELECTROCONDUCTIVE GLASS LAMINATE

This application claims benefit to U.S. Provisional application Ser. No. 60/122,359, filed Mar. 2, 1999.

FIELD OF THE INVENTION

The present invention relates to a laminate provided with an organic electroconductive layer, the laminate comprising a thin glass layer and a support which is preferably a plastic support. This material can be used as an electrode in devices such as displays, photovoltaic cells and light-emitting diodes.

BACKGROUND OF THE INVENTION

The specific properties of glass make it a suitable substrate for carrying electroconductive layers in electric or semiconductor devices such as flat panel displays, electroluminescent panels, cathode ray tubes (CRTs), photovoltaic cells, etc. In addition to a high thermal and dimensional stability, glass has many other beneficial properties compared to plastic materials, e.g. the ease of recycling, excellent hardness and scratch resistance, high transparency, good resistance to chemicals such as organic solvents or reactive agents, low permeability of moisture and gases, and a very high glass transition temperature, enabling the use of high-temperature processes for applying an electroconductive layer. However, the main problems associated with the use of glass as a substrate in electric or semiconductor devices are its high specific weight, brittleness and low flexibility. The latter problems require that the coating of a functional layer on glass is typically carried out in a batch process (sheet by sheet), whereas the application of layers on a plastic support is generally performed as a continuous process, e.g. by using a web coater or continuous printing techniques such as screen or offset printing. It is well-known that the productivity and cost efficiency of a continuous (web) coating process is significantly higher than of a batch (sheet) coating process.

Some applications require electroconductive substrates which are characterised by a low weight and sufficient flexibility, e.g. liquid crystal displays in portable devices, electroconductive substrates having a curved geometry such as in car dashboards or batteries, and photovoltaic cells (often called solar cells) for use on roofs or as a power supply of satellites, etc. For these applications, plastic foils may be used as substrate for carrying electroconductive layers in spite of the many disadvantages compared to glass. The high permeability of oxygen and water through plastic substrates degrades the electroconductive layers rapidly. Some progress has been made on producing plastic foils with barrier layers to limit said permeability; however the lifetime of electric devices in which such conducting plastic foils are used is still limited and needs to be improved.

In addition, an inorganic conducting layer such as indium-tin oxide (ITO) is brittle and as a result, the electroconductivity of an ITO layer is susceptible to deterioration by simply bending the flexible plastic substrate. All these effects limit the lifetime of such plastic-based devices considerably. Other problems associated with inorganic electroconductive layers such as ITO are the high cost associated with vacuum-deposition techniques such as sputtering which are required to apply the inorganic layer;

the high surface roughness of the inorganic layer which makes it difficult to apply thereon thin layers such as electroluminescent polymer layers used in organic light-emitting displays or diodes (OLEDs) or photoconductive polymer layers in solar cells;

ITO requires an annealing step at an elevated temperature which is not compatible with most plastic substrates;

ITO may generate oxygen which attacks adjacent layers such as poly(p-phenylenevinylene) used in OLEDs.

sputtered inorganic layers are often characterised by the presence of a large number of pinholes.

Organic conducting layers have been developed which are not characterised by the above disadvantages. The production and the use of electroconductive polymers are well known in the art. In DE-A-41 32 614 the production of film-forming, electroconductive polymers by anodic oxidation of pyrroles, thiophenes, furans or aromatic amines (or their derivatives) is effected with a sulphone compound present in the electrolyte solution. The preparation of electroconductive polythiophenes and polypyrroles is described in U.S. Pat. No. 5,254,648 and in U.S. Pat. No. 5,236,627 respectively. In EP-A-440 957 a method for preparing polythiophene in an aqueous environment and applying polythiophene from an aqueous solution has been described. Such a solution is up until now mostly used in photographic materials as disclosed in e.g. U.S. Pat. No. 5,312,681, U.S. Pat. No. 5,354,613 and U.S. Pat. No. 5,391,472. In EP-A-686 662 it has been disclosed that layers of polythiophene coated from an aqueous composition could be made with high conductivity.

Such organic electroconductive layers can be coated on glass for various applications. WO 98/01909 describes a light-emitting diode wherein an ITO layer has been overcoated with an organic polymer selected from polyfurans, polypyrroles, polyanilines, polythiophenes and polypyridines. A similar combination has been described in Philips Journal of Research, Vol.51, No.4, p518–524 (1998). DE-A-41 29 282 discloses heat protection windows obtained by coating a polythiophene on glass or plastic sheets and DE-A-42 26 757 describes a similar antistatic and heat protection layer on a laminated glass such as a car windshield. The glass layers in a car windshield have a typical thickness of 2.1 mm. The electric resistivity of such antistatic and heat protection coatings has a typical value of >$10^5$ Ω/square, which is far too high to be suitable as an electroconductive layer. EP-A-669 205 describes a glass/plastic laminate wherein an electroconductive layer is applied between the glass and plastic sheets of the laminate for de-icing or thermally insulating safety glass in vehicles. Such material can neither be used as an electrode because the electroconductive layer is insulated between the glass and plastic layer.

SUMMARY OF THE INVENTION

It is an object of the present invention to provide a material wherein an electroconductive layer is provided on a substrate which is characterised by the known advantages of glass, i.e. a high dimensional and thermal stability, excellent hardness and scratch resistance, good resistance to chemicals and low permeability of water vapour and oxygen. This object is realised by the material defined in claim 1.

It is a particular object of the present invention to provide a material which, in addition to the above advantageous properties, has a low specific weight and which can be manufactured by using a continuous web or roll coating or printing method for applying said electroconductive layer on said substrate, i.e. on a substrate which is characterised by sufficient flexibility and which does not easily break. These objects are realised by the material defined in claim 2. Preferred embodiments of the material according to the present invention are specified in the dependent claims.

DETAILED DESCRIPTION OF THE INVENTION

In the present invention, organic conducting layers are provided on a glass/support laminate so that an improved material is obtained which can be used as an electrode for making electric or semiconductor devices characterised by a much longer lifetime than known devices. A laminate, wherein the glass layer has a thickness of at most 500 μm, is further characterised by a low specific weight and improved mechanical flexibility. The latter advantage enables the use of continuous web coating or printing methods for making such devices at a reduced cost.

The feature "flexible" as used herein means that the material is capable of being wound around a core without breaking. A preferred laminate according to the present invention is capable of being wound around a cylindrical core having a radius of 1.5 m without breaking. The lower the thickness of the glass, the higher is its flexibility and thus the lower the minimum radius of the core around which the material can be wound without breaking. However, the brittleness of the glass is inversely proportional to the thickness of the glass and the best compromise between flexibility and brittleness depends on the application. The glass used in the present invention has preferably a thickness in the range from 10 to 500 μm. For some applications, a thickness lower than 300 μm or even lower than 200 μm may be preferred. For lower brittleness a thickness of not less than 30 μm or even not less than 50 μm may be preferred.

The laminate used in the present invention for carrying an electroconductive layer comprises a glass layer and a support. The term "laminate" as used herein shall be understood as "a material consisting of a plurality of bonded layers". The glass layer and the support layer may be bonded to each other by applying an intermediate adhesive layer between said bonded layers but also vacuum lamination can be used. The adhesive layer can be a pressure-sensitive adhesive, a thermo-sensitive adhesive, a UV-curable adhesive, etc. More details of preferred laminates for use in the present invention are described in the patent applications WO/EP98/05748, filed on Sep. 9, 1998, and WO/EP98/06455, filed on Jul. 10, 1998.

The term "support" is used in the meaning of a "self-supporting layer" so as to distinguish it from layers which may be coated on a support but which are not self-supporting. The support, which according to the present invention is laminated to the glass layer, can be paper or metal and more preferably an organic resin such as cellulose acetate, poly(vinyl acetal), polystyrene, polycarbonate (PC), poly(ethylene terephthalate) (PET), polyethylene, polypropylene, polyethersulphon (PES), polydicyclopentadieen (PDCP), or copolymers thereof, e.g. a copolymer of acrylonitrile, styrene and butadiene. PET, PC, PES and PDCP are highly preferred. The support has preferably a thickness of less than 500 μm and even more preferably less than 250 μm. When the laminate of the present invention is used in high-temperature processes, it may be beneficial to use a very thin support, e.g. having a thickness ranging from 10 to 50 μm, so as to avoid extensive curl of the material due to different thermal shrinkage or expansion of the glass and the support. When used in displays, photovoltaic cells or LEDs, the support is preferably a transparent support. In a preferred embodiment the support as well as the adhesive layer, which may be present between the support and the glass, are characterised by substantially the same refractive index as the glass.

Flexible glass is known in the art. EP-A 716 339 describes a thin glass substrate having a thickness lower than 1.2 mm, a failure stress (under tensile stress) equal to or higher than $1 \times 10^7$ Pa and an elasticity modulus (Young's modulus) equal to or lower than $1 \times 10^{11}$ Pa. The glass may be e.g. sodium float glass, chemically strengthened glass or borosilicate glass. Such glass can be made by squeezing semi-molten glass between metal rollers to produce a thin web. U.S. Pat. No. 4,388,368 describes the following method to produce flexible glass sheets. A soda lime glass ($Na_2O.CaO.SiO_2$=15:13:72 by weight) molten at 1550° C. is drawn and rolled. The glass thus formed is supported by clips at both ends and heated at about 350° C. Thereafter the glass sheet is stretched to from 1.05 to 10 times the area of the original sheet while blowing a hot blast of air at a temperature lower than the aforesaid heating temperature onto the glass sheet, e.g. about 700° C. In this way, the glass sheet is cooled faster at thin portions, and thereby the thickness of the glass sheet thus stretched is maintained uniform. A similar method has been described in JP-A 58,095,622. In another method, described in JP-A 58,145,627, a web of molten glass is pulled upward and immediately drawn horizontally using large rollers onto the surface of a molten metal bath, followed by gradual cooling. The glass thus obtained has improved flatness.

Highly preferred glass for use in the present invention is thin borosilicate glass which is very strong compared to regular sodium float glass. Borosilicate glass comprises $SiO_2$ and $B_2O_3$. The detailed composition of some borosilicate glass types has been described in e.g. U.S. Pat. Nos. 4,870034, 4,554,259 and 5,547,904. Preferred thin borosilicate glass for use in the present invention is commercially available from e.g. Deutsche Spezialglass AG (Desag, Germany), a Schott Group company, as types AF45 and D263 with a thickness as low as 30 μm. According to the technical brochure "Alkali Free and Low Alkali Thin Glasses", subtitle "AF45 and D263: Thin Glasses for Electronic Applications", published by Desag in 1995, thin borosilicate glass is available in a thickness of 30 μm, 50 μm, 70 μm, 100 μm, 145 μm, 175 μm, 210 μm, 300 μm, 400 μm, 550 μm and 700 μm.

Chemically strengthened float glass is also known to have greater strength than regular float glass. Chemically strengthened glass is glass wherein at both surface layers the original alkali ions are at least partially replaced by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. Known methods for producing chemically strengthened glass are processes wherein glass is exposed to ion exchange conditions as described in e.g. JP-A 56,041,859, GB 1,208,153 and U.S. Pat. No. 3,639,198. More details about chemical strengthening of glass are given in e.g. "Glass Technology", Vol. 6, No. 3, page 90–97, June 1965.

The high strength of borosilicate glass compared to other glass types can be measured by the so-called ring-on-ring method of DIN no. 52300-5 (=EN 1288-5) which uses a gradually increasing displacement of a ring towards a glass sheet which is supported by another ring. During said displacement, a gradually increasing tensile force is applied upon the surface of the glass. The method specified above is not appropriate to characterise thin glass as used in the present invention. However, the inventors of the present patent application have demonstrated by final element analysis that the method can be modified to make it suitable for measuring such thin glass: it was found that the tensile strength σ of glass, having a thickness d, may be calculated from the maximum force F(max) that is applied at the moment of glass breakage according to the following formula:

$$\sigma = F(\max) \times K / d^2$$

$$\text{with } K = \frac{3(1+\mu)}{2\mu}\left[\ln\frac{r_2}{r_1} + \frac{(1-\mu)(r_2^2 - r_1^2)}{(1+\mu)2r_3^2}\right]$$

wherein $\mu$ is the Poisson coefficient of the glass en $r_1$, $r_2$ and $r_3$ are geometrical parameters of the rings used in the experimental measuring device (respectively 6 mm, 30 mm and 58.8 mm). More details of the used method can be found in the DIN specification referred to above.

32 samples of each glass type in table I were measured using the above modified method and the mean tensile strength $\sigma_m$ and corresponding standard deviation S were calculated. Finally, the quantity ($\sigma_m$–3S) was calculated as a criterion for probability of breakage: materials characterised by ($\sigma_m$–3S)<0 break very easily, whereas materials with ($\sigma_m$–3S)>0 have a low probability of breakage and the more positive the value of ($\sigma_m$–3S) is, the lower the probability of breakage. The borosilicate glass types D263 and AP45, specified above, were compared with sodium glass that has been chemically strengthened during the periods indicated in Table 1. All samples had a square shape of 100×100 mm and a thickness of 70 $\mu$m. The results in Table 1 clearly indicate that borosilicate glass has a far superior strength compared to chemically strengthened glass. Another conclusion that can be made from the data in Table 1, which is quite surprising, is that chemical hardening does not seem to decrease the probability of breakage.

TABLE 1

| | Sodium glass chemically hardened during | | | | | Borosilicate | |
|---|---|---|---|---|---|---|---|
| | 0 min. | 15 min. | 30 min. | 45 min. | 60 min. | D263 | AF45 |
| $\sigma_m$ - 3S (MPa) | –840 | –260 | –760 | –560 | –1180 | +600 (a) | +380 |

(a) the value obtained for D263 is probably too high because the glass came loose from the ring during the measurements; this did not occur for AF45.

The organic electroconductive layer is preferably applied on the flexible laminate with a web coating method. Even if the glass layer would break during coating due to a sharp local pressure on its surface, the glass fragments remain fixed to the support. In addition, the support prevents breakage of the web as a whole and the coating process is not interrupted. As a result, a flexible glass laminate enables industrial roll-to-roll manufacturing of e.g. flat panel displays or solar cells, thereby significantly reducing the costs of the process. The electroconductive layer can be applied on the support or on the glass layer of the laminate by spin coating, dip coating, rod coating, blade coating, air knife coating, gravure coating, reverse roll coating, extrusion coating, slide coating and curtain coating. An overview of these coating techniques can be found in "Modern Coating and Drying Technology", Edward Cohen and Edgar B. Gutoff Editors, VCH publishers, Inc, New York, N.Y., 1992. A plurality of layers may be coated simultaneously, e.g. by coating techniques such as slide coating or curtain coating.

According to an alternative method, the electroconductive layer can be applied on the support, which is then laminated to thin glass to obtain the material of the present invention. Specific embodiments of higher complexity may comprise a plurality of glass layers and/or supports. According to the present invention, a laminate which comprises a glass layer and a support S1 may be laminated to another support S2 which has been provided with an organic electroconductive layers, so as to obtain a laminate corresponding to one of the following embodiments (it shall be understood that these embodiments may optionally include an adhesive layer):

S1/glass/S2/electroconductive-layer
glass/S1/S2/electroconductive-layer
S1/glass/electroconductive-layer/S2
glass/S1/electroconductive-layer/S2

In both the latter embodiments, the support S2 may be a temporary support which can be delaminated from the electroconductive layer. It is self-evident that, within the scope of the present invention, many combinations of the above embodiments can be made, e.g. a laminate which comprises one or more electroconductive layer(s) on an outer surface as well as between the constituting layers of said laminate.

It is also possible in the methods of this invention to apply the electroconductive layer to the substrate by printing techniques, e.g., ink-jet printing, gravure printing, flexo printing, offset printing etc. In this case the composition can be applied directly in the form of structured patterns, e.g. the rows and columns in a matrix electrode known from pixel-wise addressed devices such as liquid crystal displays (LCDs). The electroconductive layer applied to the substrate can be also patterned by conventional photolithographic techniques as disclosed in e.g. U.S. Pat. No. 5,561,030 and WO-A-97/18944.

After coating or printing the electroconductive layer, the material can be kept on roll or cut in sheets.

In a preferred embodiment, an electroconductive layer is provided on the glass surface of the laminate. Before applying said electroconductive layer, the surface of the glass can be pre-treated, e.g. can be etched or pre-coated with a subbing layer for a good adherence to the electroconductive layer. A highly preferred layer for improving the adherence of the electroconductive layer, in particular a polythiophene layer, to glass has been described in DE-42 26 757, p.3, 1.10–11. Other suitable subbing layers for said purpose have been described in U.S. Pat. No. 3,661,584 and GB 1,286,467. Said subbing layer preferably contains a silicon compound such as an epoxysilane which may also be added to the coating composition of the electroconductive layer. The laminate can also be coated with a. silicate sol/gel coat having preferably a thickness of at least 1 $\mu$m, and more preferably a thickness of at least 10 $\mu$m. Such a silicate sol/gel coat is typically applied on sodium glass used in a flat panel display to prevent diffusion of sodium ions to the electroconductive layer applied on the glass. When alkaline-free borosilicate glass is used in the laminate of the present invention, such a silicate sol/gel coat is not necessary.

If the material of the present invention is used in devices wherein the electrode needs to be transparent, such as displays, (O)LEDs, solar cells, etc., then the organic electroconductive layer is preferably characterised by an optical density of less than 0.3, and even more preferably less than 0.1. Since the coating of a thin layer results in a higher electric resistance, the skilled person needs to select a coating thickness which is the best compromise between transparency and conductivity. Said compromise depends on the application.

$10^4$ Ω/square is commonly regarded as an upper value of the electric resistivity of a material above which said material has insufficient electroconductivity to be suitable as an electrode. Antistatic layers have a typical electric resistivity in the range from $10^6$ to $10^9$/square and cannot be used as an electrode. The organic electroconductive layer of the present invention preferably has an electric resistivity lower than 2000 Ω/square, more preferably lower than 1000 Ω/square and most preferably lower than 500 Ω/square.

All values of electric resistivity presented in this document are measured according to the following method. The substrate coated with the electroconductive layer is cut to obtain a strip having a length of 27.5 cm and a width of 35 mm. Over the width of the strip electrodes are applied at a distance of 10 cm of each other. The electrodes are made of a conductive polymer, ECCOCOAT CC-2 available from Emerson & Cumming Speciality polymers. Over said electrode a constant potential of 1 V is applied. The current flowing through the circuit is measured on a Pico-amperemeter KEITHLEY 485. From the potential and the current, taking in account the geometry of the measurement, the resistivity in Ω/square is calculated.

The organic electroconductive layer preferably comprises an organic electroconductive polymer such as polypyrrole, polythiophene, polyfuran or a poly(aromatic amine) such as polypyridine or polyaniline. A preferred organic electroconductive polymer is poly(alkylene-3,4-dioxythiophene) such as the compounds described in EP-A-686 662. The organic electroconductive layer preferably also comprises a polyanion such as a polysulponate, e.g. poly(styrene sulphonate), and/or a di- or polyhydroxy or a carboxylic or amide group containing compound, e.g. a lactam. After being applied on the laminate and dried, such a composition may require an annealing step at an elevated temperature, e.g. between 150 and 250° C., in order to obtain a low resistivity.

A highly preferred coating composition for obtaining the organic electroconductive layer has been disclosed in EP-A no. 98203951, filed on 17.11.1998, and comprises a polythiophene, a polyanion compound and an aprotic compound A with a dielectric constant, $\epsilon, \geq 15$. This composition C enables to obtain an electroconductive layer having a resistivity of at most 2000 Ω/square by drying the coated layer at a temperature below 100° C. Preferably said polythiophene has the following formula

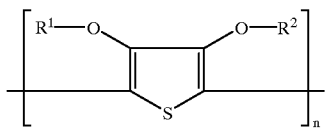

wherein $R^1$ and $R^2$ each independently represent hydrogen or a C1–C4 alkyl group or together represent an optionally substituted C1–C4 alkylene group or a cycloalkylene group, preferably an ethylene group, an optionally alkyl-substituted methylene group, an optionally C1–C12 alkyl- or phenyl-substituted 1,2-ethylene group, a 1,3-propylene group or a 1,2-cyclohexylene group. Preparation methods of the above polythiophene have also been described in the EP-A no. 98203951, referred to above.

Preferably the compound A is an aprotic solvent selected from the group of lactams, amides, sulphones, sulphoxides, organic phosphates esters, organic phosphonates, organic phosphamides, urea, derivatives of urea, polyalcohols and mixtures thereof. Typical useful compounds A are e.g. N-methyl-2-pyrrolidone, 2 pyrrolidone, 1,3-dimethyl-2-imidazolidone, N,N,N',N'-tetramethylurea, formamide, dimethylformamide, N,N-dimethylacetamide, tetramethylene sulphone, dimethylsulfoxide, hexamethylphosphamide, diethylene glycol, etc.

Even when the drying of the above coated composition C proceeds at a temperature lower than 50° C. a very low resistivity below 500 Ω/square can be achieved. Thus no annealing step is necessary which is advantageous since it simplifies the production process of polymeric conductive layers and makes it both less expensive and more ecological. Furthermore the absence of an annealing step at high temperature makes it possible to use the method of this invention for applying conductive layers on stretched polymeric films, e.g. stretched polyester, that risk to shrink and curl when treated at temperatures above 120 or 150° C. Thus the method of this invention can also be used for applying conductive polymer layers on non-heat stable polymeric objects.

The material of the present invention can be used as an electrode in various electric or semiconductor devices. Preferred examples are displays, photovoltaic cells and electroluminescent devices such as a light-emitting diodes. LCDs and solar cells are highly preferred examples. The resistivity of the organic electroconductive layer is sufficiently low to be used as electrode in a device which draws or generates a small current, such as a solar cell. However, devices which may draw a higher current, such as LEDs, may require an electrode wherein the organic electroconductive layer is combined with another layer having a better conductivity, e.g. an ITO layer.

Thus a preferred embodiment of the material according to the present invention is a glass laminate carrying an ITO layer and an organic electroconductive layer on top of said ITO layer. This material is very suitable as an electrode in OLEDs, wherein electrons and holes are injected from a cathode and anode respectively into an electroluminescent material, e.g. an electroluminescent polymer such as poly (p-phenylenevinylene) (PPV) and its derivatives, and then recombine to an exciton which relaxes to the ground state by radiative decay. Such an OLED may comprise the following layers a reflecting cathode, e.g. a low-work function metal layer such as evaporated Ca.

an electroluminescent layer, e.g. PPV; other suitable electroluminescent compounds are described in e.g. "Organische Leuchtdioden", Chemie in unserer Zeit, 31. Jahrg. 1997, No.2, p.76–86.

an hole-injection layer (in this embodiment: the organic electroconductive layer)

an transparent anode (in this embodiment the ITO layer)

a transparent substrate (in this embodiment: the laminate)

The latter three layers constitute a material according to the present invention which enables to obtain a flexible OLED having a significantly improved lifetime compared to conventional flexible devices wherein a plastic foil is used as substrate: due to the presence of the glass layer, the ITO as well as the PPV layer are protected from water vapour and oxygen. In addition, the organic electroconductive layer levels off the surface roughness of the ITO layer which is necessary to enable the coating of the electroluminescent PPV layer, which is typically very thin (100 nm).

A flexible device is preferably composed of fully organic layers as such layers are resistant to bending, distinguished from brittle inorganic layers such as ITO. Typical organic solar cells comprise a similar structure as given above, with the proviso that the electroluminescent layer is replaced by a composition wherein photo-induced electron transfer occurs between an electron-donor and an acceptor. As already mentioned above, such a photovoltaic device generates a relatively small current and, as a result, the ITO layer can be omitted so as to obtain a full-organic flexible device that can be manufactured in a cost-effective way with roll-to-roll web coating or printing.

Other electric or semiconductor devices which may benefit from the present invention are flat panel displays such as plasma displays or field-emission displays, electrolytic capacitors, circuit boards, electrochromic displays, etc. The material can also be used for screening electromagnetic radiation or earthing electric charges, for making touch screens, and in imaging systems, e.g. silver halide photography or electrophotography. Also a device such as the electronic book described in WO 97/04398 may particularly benefit from the flexible electrode of the present invention.

EXAMPLES

While the present invention will hereinafter be described in connection with preferred embodiments thereof, it will be understood that it is not intended to limit the invention to those embodiments.

Preparation of a polythiophene dispersion (hereinafter referred to as "APT")

a) Into 1000 ml of an aqueous solution of 14 g of polystyrene sulphonic acid (218 mmol of $SO_3H$ groups) with number-average molecular weight (Mn) 40,000, were introduced 12.9 g of potassium peroxodisulfate ($K_2S_2O_8$), 0.1 g of $Fe_2(SO_4)_3$ and 5.68 g of 3,4-ethylenedioxythiophene. The thus obtained reaction mixture was stirred for 24 h at 20° C. and subjected to desalting.

b) 500 ml of the above prepared reaction mixture were diluted with 500 ml of water and stirred for 6 hours at room temperature in the presence of a granulated weak basic ion exchange resin LEWATIT H 600 (trade name of Bayer AG, Leverkusen, Germany) and strongly acidic ion exchanger LEWATIT S 100 (trade name of Bayer AG, Leverkusen, Germany). After said treatment the ion exchange resins were filtered off and the potassium ion and sulphate ion content were measured which were respectively 0.4 g $K^+$ and 0.1 g $(SO_4)^{2-}$ per liter.

Example 1

417 ml of dispersion PT and 50 g of methylpyrrolidone (compound A) were mixed with a binder (8.5 ml of a 30% dispersion of co(vinylidenechloride/methylacrylate/itaconic acid 88/10/2), a surfactant (0.5 ml of FLUORAD FC430, trade name of 3M) and the following compound for improving adhesion and scratch resistance

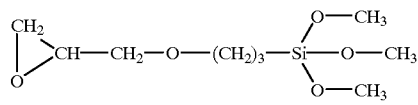

The mixture was diluted to 1000 ml with distilled water and then coated at a wet thickness of 100 mµ on a 100 µm PET film, which was provided with a subbing layer, and dried at 35° C. The electroconductive layer thus obtained comprised 500 mg/m² of polythiophene.

This material was then laminated to a thin borosilicate glass type AF45 with thickness 400 µm, available from Deutsche Spezialglass AG (Desag, Germany), a Schott group company, so as to obtain a laminate according to the present invention, consisting of (in the order given) a glass layer, an adhesive layer, a PET layer and an organic electroconductive layer. The adhesive layer was polyethylene which was coated on the back side of the PET support before lamination. The lamination was carried out in a laboratory clean room so as to avoid dust particles between the glass and PET layer as much as possible, using a standard laminator which comprises a pair of heatable rollers, having an adjustable pressure and moving at an adjustable speed.

The electric resistivity of the material thus obtained was 330 Ω/square (measured as described above). The optical density was 0.23.

Example 2

The same material as described in Example 1 was prepared using the following coating composition for the organic electroconductive layer: 625.5 ml PT, 8.3 ml binder, 0.5 ml surfactant (both the same as in Ex.1), 50 ml isopropanol and 50 ml diethylene glycol. This composition was diluted with distilled water up to 1000 ml, coated at a wet thickness of 40 µm and dried at 110° C. The material comprised 300 mg/m² of polythiophene and was characterised by an electric resistivity of 340 Ω/square and an optical density of 0.09.

Example 3

A flexible borosilicate glass sheet type AF45 of size 300×200 mm and thickness 100 µm was laminated to a similar PET foil as described in Example 1, said foil being coated on one side with a polyethylene layer which acted as an adhesive layer. The polyester foil had a thickness of 170 µm, a width of 23 cm and a length of 5.6 m, the latter corresponding to the web length of the laboratory cascade-coater used in this experiment. In said coater the web forms an endless loop which travels along a triangular path defined by 3 rollers of which the smallest has a radius of 5 cm. The laminate was mounted in said laboratory web-coater and the same coating composition as described in Example 1 was applied on the glass side of the laminate, again at a wet thickness of 100 mµ, and then dried at a temperature of 35° C. The electroconductive material thus obtained had an electric resistivity of 350 Ω/square.

What is claimed is:

1. A material comprising a substrate and an organic electroconductive layer provided on said substrate, wherein the substrate is a laminate comprising a glass layer having thickness from 10 to 500 µm and a support.

2. A material according to claim 1, wherein the glass layer is a flexible layer having a thickness from 30 to 300 µm.

3. A material according to claim 1, wherein the glass layer is a flexible layer having a thickness from 50 to 200 µm.

4. A material according to claim 1 wherein the glass layer is a borosilicate glass layer.

5. A material according to claim 1 wherein the organic electroconductive layer comprises a polythiophene.

6. A material according to claim 1 having an electric resistivity lower than 2000 Ω/square.

7. A method for making an electroconductive substrate by coating a solution comprising an organic electroconductive polymer onto a web of a flexible laminate which comprises a glass layer having thickness from 10 to 500 µm and a support.

8. A method according to claim 1 wherein the electroconductive substrate has an electric resistivity lower than 2000 Ω/square which is obtained by drying the coated solution at a temperature below 100° C.

* * * * *

UNITED STATES PATENT AND TRADEMARK OFFICE
CERTIFICATE OF CORRECTION

PATENT NO. : 6,197,418 B1
DATED : March 6, 2001
INVENTOR(S) : Tom Cloots et al.

It is certified that error appears in the above-identified patent and that said Letters Patent is hereby corrected as shown below:

<u>Column 5,</u>
Line 28, "AP45" should read -- AF45 --.

<u>Column 7,</u>
Line 5, -- Ω -- should be inserted before "/square".

<u>Column 9,</u>
Line 24, "APT" should read -- PT --.

<u>Column 10, claim 8,</u>
Line 62, "claim 1" should read -- claim 7 --.

Signed and Sealed this

Twenty-sixth Day of March, 2002

Attest:

JAMES E. ROGAN
*Attesting Officer*     *Director of the United States Patent and Trademark Office*